United States Patent
Sbuell

(10) Patent No.: US 9,729,145 B2
(45) Date of Patent: Aug. 8, 2017

(54) CIRCUIT AND A METHOD FOR SELECTING A POWER SUPPLY

(75) Inventor: Richard Sbuell, Graz (AT)

(73) Assignee: Infineon Technologies AG, Neubiberg (DE)

( * ) Notice: Subject to any disclaimer, the term of this patent is extended or adjusted under 35 U.S.C. 154(b) by 1108 days.

(21) Appl. No.: 13/494,055

(22) Filed: Jun. 12, 2012

(65) Prior Publication Data

US 2013/0328414 A1  Dec. 12, 2013

(51) Int. Cl.
*H02J 1/00* (2006.01)
*H03K 17/693* (2006.01)
*G06F 1/26* (2006.01)

(52) U.S. Cl.
CPC .......... *H03K 17/693* (2013.01); *G06F 1/263* (2013.01); *Y10T 307/76* (2015.04)

(58) Field of Classification Search
CPC ............................ Y10T 307/76; H03K 17/693
USPC ... 307/71, 72, 80, 81, 85, 86, 112, 113, 115, 307/116
See application file for complete search history.

(56) References Cited

U.S. PATENT DOCUMENTS

| | | | | |
|---|---|---|---|---|
| 4,716,322 A | * | 12/1987 | D'Arrigo et al. | 327/143 |
| 5,187,396 A | * | 2/1993 | Armstrong, II | H03K 5/2472 |
| | | | | 307/85 |
| 5,585,775 A | * | 12/1996 | Ishishita | 338/32 R |
| 5,914,585 A | | 6/1999 | Grabon | |
| 5,929,615 A | * | 7/1999 | D'Angelo et al. | 323/224 |
| 6,285,091 B1 | * | 9/2001 | Chan | H02J 9/061 |
| | | | | 307/64 |
| 6,774,704 B2 | * | 8/2004 | Kushnarenko | 327/530 |
| 7,358,794 B2 | | 4/2008 | Kawagoshi | |
| 7,893,560 B2 | * | 2/2011 | Carter | 307/64 |
| 2002/0113494 A1 | * | 8/2002 | Winick et al. | 307/85 |
| 2004/0125627 A1 | * | 7/2004 | Nadd et al. | 363/125 |
| 2005/0012689 A1 | * | 1/2005 | Abdoulin | 345/60 |
| 2005/0189984 A1 | * | 9/2005 | Kawagoshi | 327/538 |
| 2007/0164614 A1 | * | 7/2007 | Dias et al. | 307/80 |
| 2008/0084195 A1 | * | 4/2008 | Frew et al. | 323/282 |
| 2010/0066431 A1 | | 3/2010 | Carter | |

FOREIGN PATENT DOCUMENTS

| | | |
|---|---|---|
| CN | 1661894 A | 8/2005 |
| CN | 101523327 A | 9/2009 |
| EP | 0442688 A2 | 8/1991 |
| WO | 2008042764 A1 | 4/2008 |

* cited by examiner

*Primary Examiner* — Rexford Barnie
*Assistant Examiner* — Dru Parries
(74) *Attorney, Agent, or Firm* — Viering, Jentschura & Partner mbB

(57) ABSTRACT

A circuit is provided, the circuit including: a first power supply terminal connected to a first p-type metal oxide semiconductor transistor; a second power supply terminal connected to a second p-type metal oxide semiconductor transistor; an output node connected between the first p-type metal oxide semiconductor transistor and second p-type metal oxide semiconductor transistor; and a decision circuit connected to the first power supply terminal and the second power supply terminal, wherein the decision circuit is powered by the output node and wherein gate terminals of the first p-type metal oxide semiconductor transistor and second p-type metal oxide semiconductor transistor are complementarily and actively controlled by the decision circuit.

23 Claims, 8 Drawing Sheets

PRIOR ART

| Supply | Decision Speed | Current consumption |
|---|---|---|
| A present, B floating | fast (ns range) | increased (uA range) |
| B present, A floating | slow (us range) | low (nA range) |
| A present, B floating | fast (ns range) | increased (uA range) |

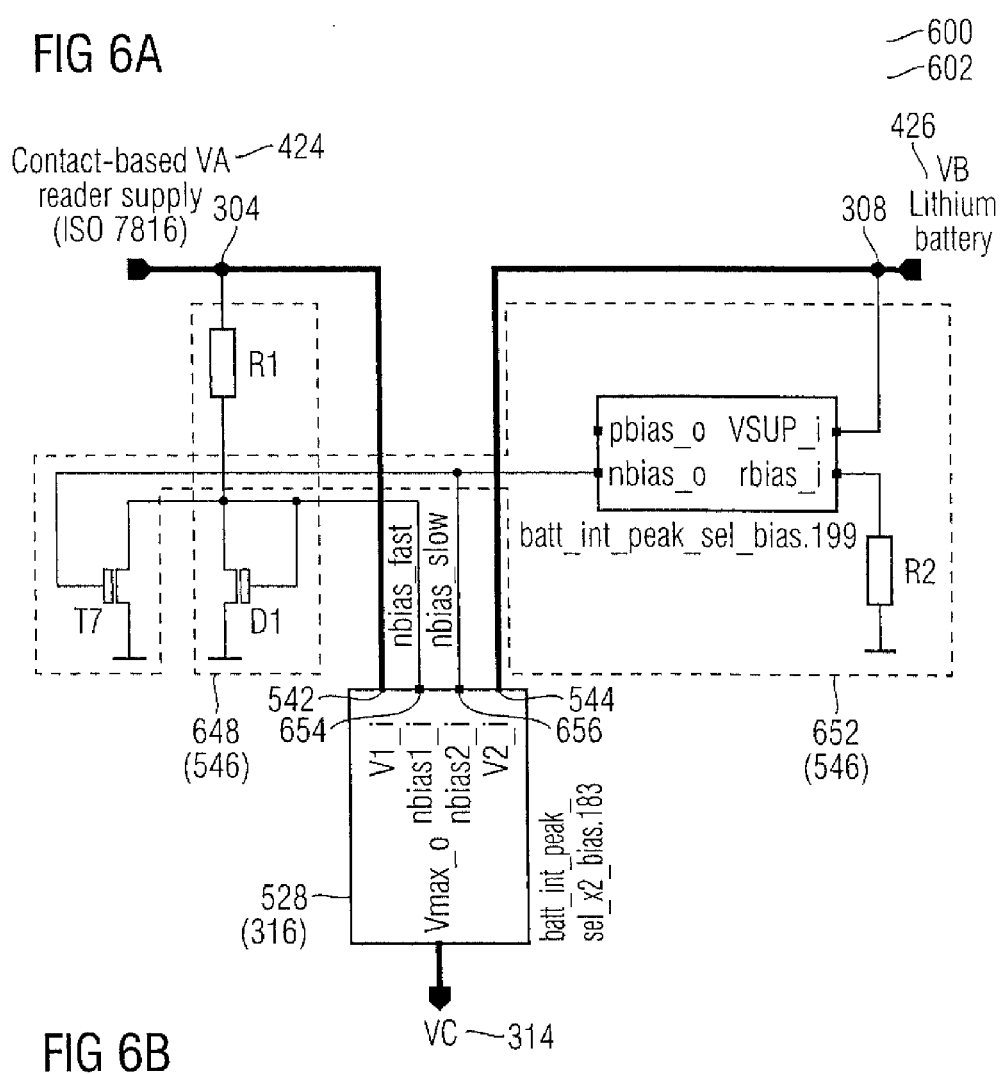
| Power Supply A | Power Supply B | Biasing | Decision Speed |
|---|---|---|---|
| Floating | Available | slow (nA range) | slow (uS range) |
| Available | Floating | fast (uA range) | fast (ns range) |
| Available | Available | slow + fast (uA range) | fast (ns range) |

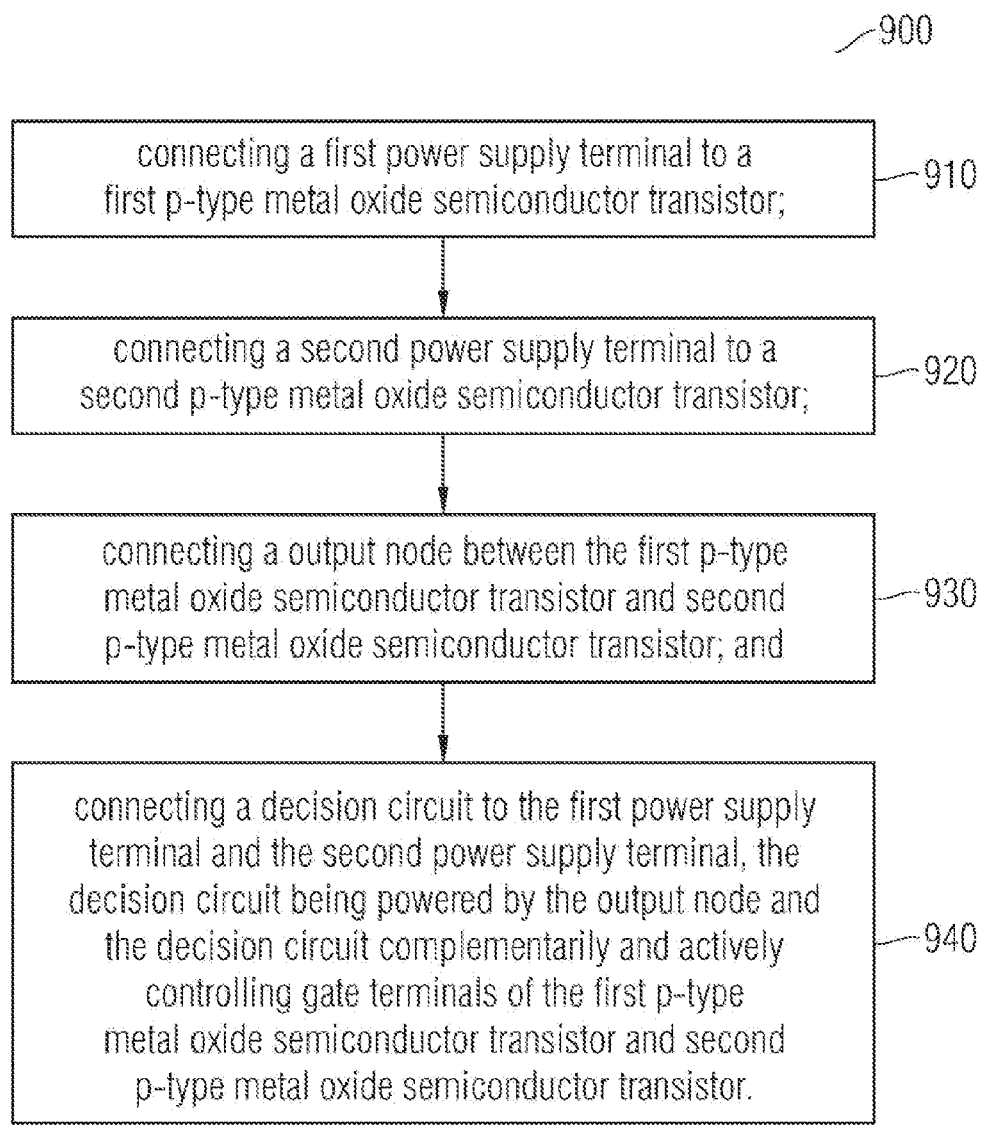

CIRCUIT AND A METHOD FOR SELECTING A POWER SUPPLY

TECHNICAL FIELD

Various embodiments relate generally to a circuit and a method for selecting a power supply.

BACKGROUND

Up until now, power supply selection has been implemented by one of two methods. FIG. 1 shows power supply selection (circuit 102) using low threshold NMOS transistors 106, 112 in diode configuration. Output C 114 may be connected to power supply A 104, if supply voltage VA is larger than supply voltage VB supplied by power supply B 108, and voltage VC at output C 114 equals VA−VGS1. Output C 114 may be connected to power supply B 108, if supply voltage VB is larger than supply voltage VA supplied by power supply A 104, and voltage VC at output C 114 equals VB−VGS2. The voltage drop VGS is the sum of the threshold voltage VTH and the on voltage VON of a NMOS diode. VTH increases with VA or VB due to the body effect. VON increases with the diode current ID1 from power supply A to C or ID2 from power supply B to C. The power dissipation in a diode equals to VGS1×ID1 or VGS2×ID2. The supply voltage available at output C may be reduced by the voltage drop VGS which cannot be tolerated in low supply voltage designs, e.g. as may be the case in the field of chip cards. Furthermore, VGS is dependent on supply voltage, current consumption and device variation over process and temperature. If the voltage difference between power supply A 104 and B 108 approaches zero, output C is supplied by power supply A 108 as well as power supply B 108. If the diode length is decreased (in terms of reducing circuit area consumption), the leakage current, e.g. from power supply A 104 to power supply B 108, or e.g. from power supply B 108 to power supply A 104 increases significantly. Furthermore, the power VGS×ID is dissipated in the selection circuit 102.

FIG. 2 shows power supply selection (circuit 202) using cross coupled PMOS switches. Output C 214 may be connected to power supply A 204, if supply voltage VA supplied by power supply A 204 is larger than the sum of supply voltage VB supplied by power supply B 208 and threshold voltage VTH1 of PMOS switch P1 206. Voltage VC at output C 214 equals VA−VDS1. Output C 214 may be connected to power supply B 208, if supply voltage VB supplied by power supply B 208 is larger than the sum of supply voltage VA supplied by power supply A 204 and threshold voltage VTH2 of PMOS switch P2 212. Voltage VC at output C 214 equals VB−VDS2. The drain to source voltage drop VDS at a PMOS switch, e.g. 206, 212, is much smaller than the gate to source voltage drop VGS at a NMOS diode e.g. 106, 112, in FIG. 1. Therefore the power dissipation in the circuit may be significantly reduced in comparison to FIG. 1. However, the overdrive voltage VO of a PMOS switch, e.g. 206, 212, equals VA−VB−VTH (in other words VO=VA−VB−VTH) and is therefore dependent on the voltage difference between power supply A 204 and power supply B 208. The voltage drop VDS at a PMOS switch, e.g. 206, 212, may be dependent on VO and may increase significantly if the voltage difference between VA and VB becomes smaller. If the voltage difference between power supply A 204 and power supply B 208 becomes smaller than or equal to VTH, output C may be neither connected to power supply A nor to power supply B. Therefore output C may be floating.

SUMMARY

Various embodiments provide a circuit, including: a first power supply terminal connected to a first p-type metal oxide semiconductor transistor; a second power supply terminal connected to a second p-type metal oxide semiconductor transistor; an output node connected between the first p-type metal oxide semiconductor transistor and second p-type metal oxide semiconductor transistor; and a decision circuit connected to the first power supply terminal and the second power supply terminal, wherein the decision circuit is powered by the output node and wherein gate terminals of the first p-type metal oxide semiconductor transistor and second p-type metal oxide semiconductor transistor are complementarily and actively controlled by the decision circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6A shows a circuit according to an embodiment;
FIG. 6B shows biasing and decision speed of a circuit according to an embodiment;
FIG. 9 shows a method for selecting a power supply According to an embodiment.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

A power selection circuit may connect an output terminal, e.g. output C to a first power supply or to a second power supply, e.g. power supply A or power supply B, depending on the voltage level of A and B. On one hand the selection circuit should work at very low power consumption and on the other hand the decision which supplies the selection should be fast. Therefore, the selection circuit may support a slow mode at ultra low power consumption and a fast mode at higher power consumption. The decision circuit should work stand-alone without any reference voltage (or current) needed and should be supplied whether by power supply A or B at any one time during power up. In other words, the decision circuit should be supplied by one of power supply A or power supply B at any one time during power up. Additionally the voltage drop of the connection between supply inputs and output should be very small to keep power dissipation of the connection between any of power supply A, power supply B and output terminal C at a minimum level. If a power difference, e.g. voltage difference between power supply A and power supply B approaches zero, the power selection circuit should decide for one power supply, thereby preventing oscillations or undefined circuit states, e.g. choosing both power supplies A and B, e.g. choosing neither of power supplies A and B. The power selection circuit may be configured to implement a hysteresis which prevents these undefined circuit states.

Figure 1:
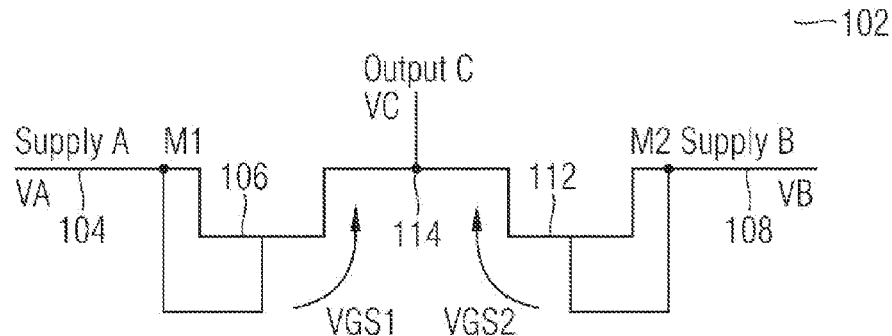
FIG. 1 shows a power supply selection circuit.
Figure 2:
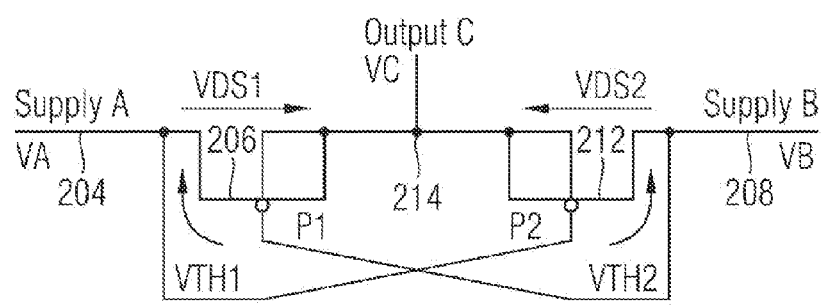
FIG. 2 shows a power supply selection circuit.
Figure 3:
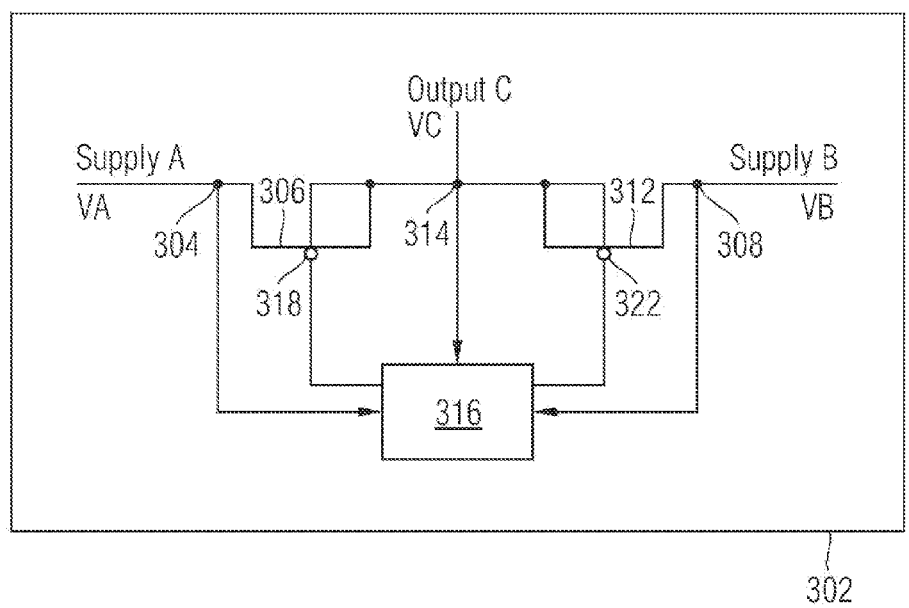
FIG. 3 shows a circuit according to an embodiment.

FIG. 3 shows circuit 302 according to an embodiment. Circuit 302 may include: first power supply terminal 304 connected to first p-type metal oxide semiconductor (PMOS) transistor 306; a second power supply terminal 308 connected to second p-type metal oxide semiconductor (PMOS) transistor 312; output node 314 connected between first p-type metal oxide semiconductor transistor 306 and second p-type metal oxide semiconductor transistor 312; and decision circuit 316 connected to first power supply terminal 304 and the second power supply terminal 308, wherein decision circuit 316 is powered by output node 314 and wherein gate terminals 318, 322 of the first p-type metal oxide semiconductor transistor and second p-type metal oxide semiconductor transistor are complementarily and actively controlled by decision circuit 316.

Figure 4:
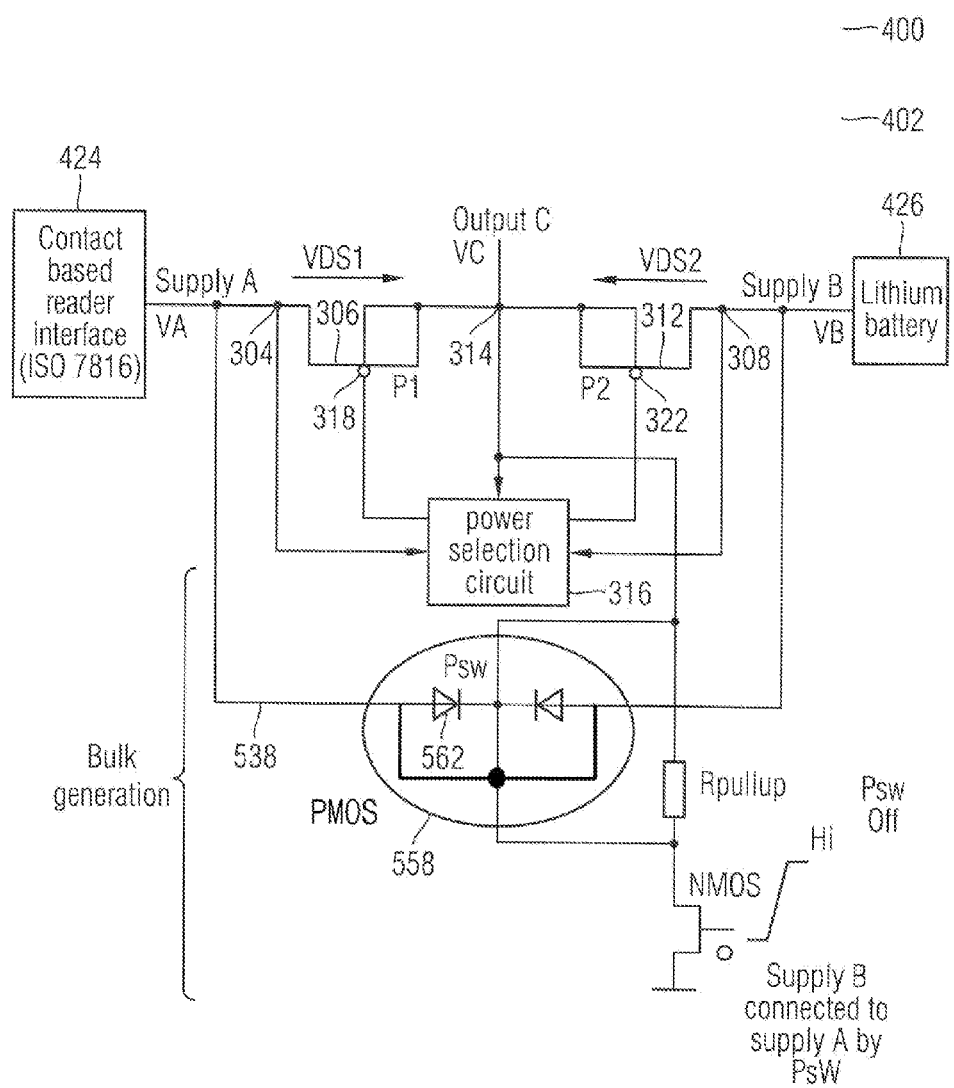
FIG. 4 shows a circuit according to an embodiment.

FIG. 4 shows circuit 402 according to an embodiment. Circuit 402 may include: first power supply terminal 304 connected to first p-type metal oxide semiconductor transistor 306; a second power supply terminal 308 connected to second p-type metal oxide semiconductor transistor 312; output node 314 connected between first p-type metal oxide semiconductor transistor 306 and second p-type metal oxide semiconductor transistor 312; and decision circuit 316 connected to first power supply terminal 304 and the second power supply terminal 308, wherein decision circuit 316 is powered by output node 314 and wherein gate terminals 318, 322 of the first p-type metal oxide semiconductor transistor and second p-type metal oxide semiconductor transistor are complementarily and actively controlled by decision circuit 316.

According to various embodiments, circuit 402 may include a power selection circuit, e.g. decision circuit 316 which may implement power supply selection by two actively controlled PMOS switches, e.g. PMOS transistors 306, 312. The voltage drop, e.g. drain-source voltage drops VDS1, VDS2, at PMOS transistors 306, 312 may be minimized and not be dependent, i.e. be independent, on the voltage difference, e.g. VA−VB or VB−VA, as the overdrive voltage VO of a switch 306, 312 equals VA−VTH1 or VB−VTH2. Therefore the voltage available at output C may be maximized and the power dissipation VDS×ID in decision circuit 316 may be minimized.

According to various embodiments, output node 314, e.g. output C may always be connected, e.g. electrically connected to only one of the power supply terminals A and B 304, 308 even if the voltage difference supplied between their inputs approaches zero.

According to various embodiments, adaptive biasing of decision circuit 316, e.g. the active power selection circuit, may allow a compromise between power consumption and decision speed.

An application for circuits 302, 402, may be in the field of chip cards, which may require that second power supply terminal 308, be permanently connected a power supply B 426, which may include a power source, e.g. a battery, and first power supply terminal 304 may be connected to power supply A 424 which may be supplied via a reader device, e.g. a chip card reader device. If no reader device is present, first power terminal 304, e.g. power supply A 424, may be floating and output node 314, e.g. output C may be connected to power supply B 426 via second power supply terminal 308. In this case the quiescent current consumption of decision circuit 316, e.g. the active power selection circuit, may be in the range of a few nano-Amperes (nA) as power supply B, e.g. the battery capacity, may be limited and the battery life cycle may last up to several years. Decision circuit 316, e.g. the power selector, may operate in ultra low power slow mode for extending battery life, although the decision speed of decision circuit 316, e.g. the power selector, may be quite slow, e.g. in the range of several microseconds. In other words, in various embodiments, a chip card may be provided which may include the one of the circuits 302, 402. The chip card may be a contact based chip card, wherein e.g. the first power supply terminal 304 may be connected to a contact pad of the chip card according to ISO 7816. In other embodiments, the chip card may also be configured as a contactless chip card or as a hybrid chip card which is configured as a contact-based as well as a contactless chip card.

In case first power supply terminal 304 starts to be supplied by power supply A 424, e.g. a reader device, then output node 314, e.g. output C, may be connected to first power supply terminal 304, e.g. power supply A 424 within several nanoseconds if VA exceeds VB plus a certain hysteresis voltage VH. Therefore, the switching circuit may operate in fast mode at the cost of increased power consumption.

If voltage VB supplied by power supply B 426 at second power supply terminal 308, is larger than the sum of voltage VA supplied by power supply A 424 at first power supply terminal 304 and hysteresis voltage VH, then output node 314, e.g. output C, may be connected, e.g. electrically connected, to power supply B 426 at second power supply terminal 308. If voltage VA supplied by power supply A 424 at first power supply terminal 304, is larger than the sum of voltage VB supplied by power supply B 426 at second power supply terminal 308 and hysteresis voltage VH, then output node 314, e.g. output C, may be connected, e.g. electrically connected, to power supply A 424 at first power supply terminal 304.

Figures 5A, 5B:
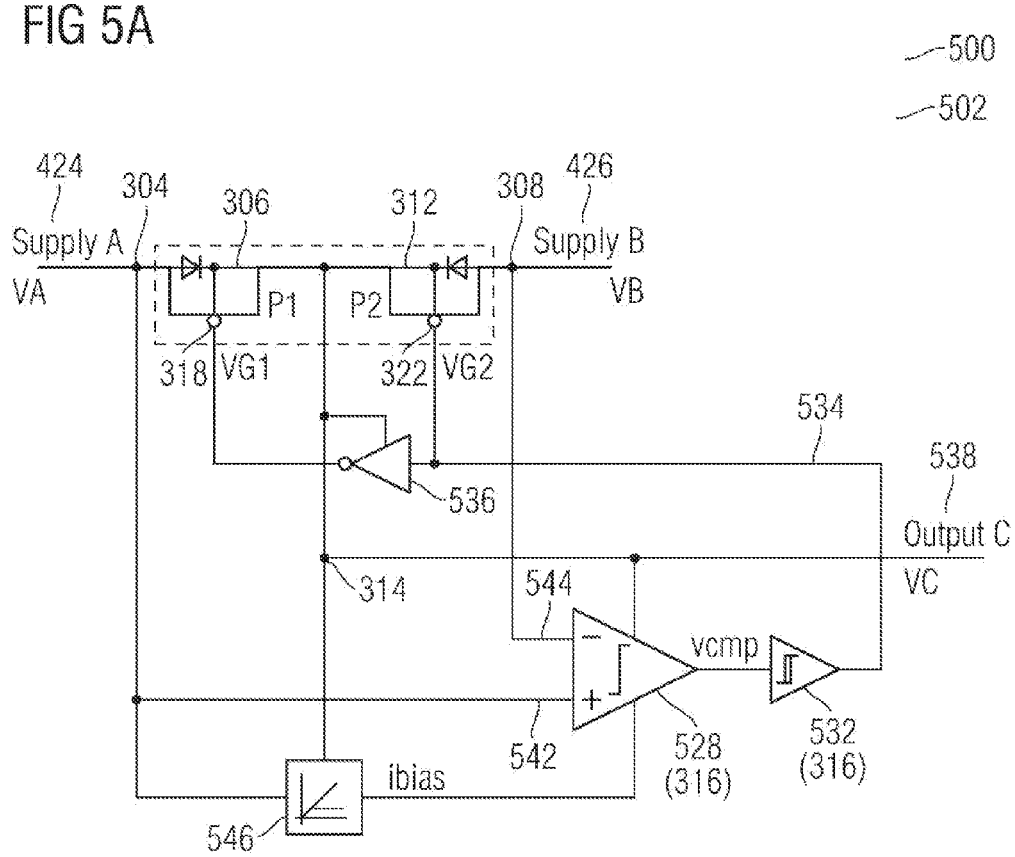
FIG. 5A shows a circuit according to an embodiment.
FIG. 5B shows decision speed and power consumption of a circuit according to an embodiment.

FIG. 5A shows circuit 502 according to an embodiment. Circuit 502 may include one or more or all of the features already described with respect to circuits 402 and 302. Circuit 502 may include an active power selection circuit providing at least two power supply input terminals S and B 304, 308, and supply output C 314. Output node 314, e.g. output C may be connected to power supply A 424 at first power supply terminal 304 if the voltage VA of power supply A 424 exceeds the voltage VB of power supply B and vice versa. The power supply selection may be controlled actively combining fast power supply selection at ultra low power consumption. Therefore, the decision speed and/or power consumption may depend of the presence of one of the two power supplies connected to the power supply terminals.

Circuit 502 may include: first power supply terminal 304 connected to first p-type metal oxide semiconductor transistor 306; a second power supply terminal 308 connected to second p-type metal oxide semiconductor transistor 312; output node 314 connected between first p-type metal oxide semiconductor transistor 306 and second p-type metal oxide semiconductor transistor 312; and decision circuit 316 connected to first power supply terminal 304 and the second power supply terminal 308, wherein decision circuit 316 is powered by output node 314 and wherein gate terminals 318, 322 of the first p-type metal oxide semiconductor transistor and second p-type metal oxide semiconductor transistor are complementarily and actively controlled by decision circuit 316.

Decision circuit 316 may include comparator circuit 528 and optionally Schmitt trigger circuit 532. Schmitt trigger circuit 532 may improve switching robustness of the circuit. Schmitt trigger circuit 532 may be connected to comparator circuit 528. Decision circuit 316 may be configured to compare power supplied by first power supply terminal 304 and power supplied by second power supply terminal 308; in other words to compare power supplied by first power supply A 424 to first power supply terminal 304 and power supplied by second power supply B 426 to second power supply terminal 308.

Power supply voltages VA and VB, which may be supplied by first power supply 424 and second power supply 426 may be compared by PMOS current comparator circuit 528. First comparator circuit input terminal 542 may be connected to first power supply terminal 304, and second comparator circuit input terminal 544 may be connected to second power supply terminal 308. The output signal of the comparator vcmp may be connected to Schmitt Trigger circuit 532. The output signal of the Schmitt trigger circuit, which may be referred to as decision circuit output signal 534 may be provided to PMOS transistors P1 306 and P2 312, which may connect one of power supply A 424 and power supply B 426 to output node 314, e.g. output C. Decision circuit output signal 534 may be provided to, e.g. connected to first p-type metal oxide semiconductor transistor 306 and second p-type metal oxide semiconductor transistor 312 via Schmitt trigger circuit 532. The gate signal at gates 318, 322 of PMOS transistors P1 306 and P2 312 may be inverted by inverter 536. Specifically, PMOS transistors P1 306 and P2 312 may work in complementary mode, therefore, depending on how inverter 536 is connected, gate 318 may receive a high signal and gate 322 may receive a low signal and vice versa. This implies that only one of the two supply input terminals A 304 and B 308 is connected to output node C 314 as only one of PMOS transistors P1 306 and P2 312 may be electrically activated, i.e. turned on, e.g. in conduction mode, while the other is electrically inactive, i.e. turned off.

Inverter 536 may be connected between first p-type metal oxide semiconductor transistor gate terminal 318 and decision circuit 316, and second p-type metal oxide semiconductor transistor gate terminal 3322 may be connected to decision circuit 316. It may be understood that according to other embodiments, inverter 536 may be connected between second p-type metal oxide semiconductor transistor gate terminal 322 and decision circuit 316, and second p-type metal oxide semiconductor transistor gate terminal 3322 may be connected to decision circuit 316. Furthermore, inverter 536 may be connected between first p-type metal oxide semiconductor transistor gate terminal 318 and second p-type metal oxide semiconductor transistor gate terminal 322. Inverter 536 may be connected between gate terminals 318, 322 of first p-type metal oxide semiconductor transistor 306 and second p-type metal oxide semiconductor transistor 312. Inverter 536 may ensure that gate terminals 318, 322 of first p-type metal oxide semiconductor transistor 306 and second p-type metal oxide semiconductor transistor 312 may be complementarily and actively controlled by decision circuit output signal 534, in other words, first p-type metal oxide semiconductor transistor 306 and second p-type metal oxide semiconductor transistor 312 are activated complementarily, in complementary mode. Inverter 536 may be configured to invert decision circuit output signal 534, such that an inverted decision circuit output signal 534*inv* is provided to, e.g. connected to, first p-type metal oxide semiconductor transistor gate terminal 318, and decision circuit output signal 534 (non-inverted) is provided to, e.g. connected to, second p-type metal oxide semiconductor transistor gate terminal 322. Therefore, gate terminals 318, 322 of first p-type metal oxide semiconductor transistor 306 and second p-type metal oxide semiconductor transistor 312 may be complementarily and actively controlled by decision circuit output signal 534, wherein decision circuit output signal 534 may be based on power supplied by first power supply terminal 304, e.g. power supply A 424, and power supplied by second power supply terminal 308, e.g. power supply B 426. Furthermore, gate terminals 318, 322 of first p-type metal oxide semiconductor transistor 306 and second p-type metal oxide semiconductor transistor 312 may be complementarily and actively controlled by decision circuit output signal 534, wherein decision circuit output signal 534 may be based on a difference in power supplied by first power supply terminal 304 and power supplied by second power supply terminal 308. Therefore, decision circuit 316 may be configured to supply decision circuit output signal 534 to electrically activate one of first p-type metal oxide semiconductor transistor 306 and second p-type metal oxide semiconductor transistor 312, and to electrically deactivate the other of first p-type metal oxide semiconductor transistor 306 and second p-type metal oxide semiconductor transistor 312. Decision circuit output signal 534 may be configured to supply decision circuit output signal 534 such that one of the first p-type metal oxide semiconductor transistor 306 and second p-type metal oxide semiconductor transistor 312 is in an on-state, and the other of first p-type metal oxide semiconductor transistor 306 and second p-type metal oxide semiconductor transistor 312 is in an off-state, wherein power may be supplied to output node 314 by a power supply electrically connected to the p-type metal oxide semiconductor transistor in the on-state.

Decision circuit 316 may include a hysteresis voltage VH, e.g. comparator circuit 528 may implement a hysteresis voltage VH. Decision circuit 316 may include a hysteresis voltage VH, wherein decision circuit output signal 534 may be configured to electrically activate first p-type metal oxide semiconductor transistor 306 and not second p-type metal oxide semiconductor transistor 312 when power supplied by first power supply terminal 304 exceeds the sum of power supplied by second power supply terminal 308 and the hysteresis voltage VH. In other words, If voltage VA supplied by 424 exceeds the sum of voltage VB supplied by 426 and VH, wherein VH equals hysteresis voltage of comparator 528, then voltage VG2 supplied to gate 322 of second PMOS transistor P2 312 may be in a high state, and voltage VG1 supplied to gate 318 of first PMOS transistor P1 306 may be in a low state, thereby turning on first PMOS transistor P1 306, while second PMOS transistor P2 remains off. Therefore, output node C 314, may be supplied with power only from first power supply A 424 via first power supply terminal 304, and not from second power supply B 426.

Conversely, decision circuit output signal 534 may be configured to electrically activate second p-type metal oxide semiconductor transistor 312 and not first p-type metal oxide semiconductor transistor 306 when power supplied by second power supply terminal 308 exceeds the sum of power supplied by first power supply terminal 304 and the hysteresis voltage VH. In other words, If voltage VB supplied by 426 exceeds the sum of voltage VA supplied by 424 and VH, wherein VH equals hysteresis voltage of comparator 528, then voltage VG1 supplied to gate 318 of first PMOS transistor P1 306, may be in a high state, and voltage VG2 supplied to gate 322 of second PMOS transistor P2 312 may be in a low state, thereby turning on second PMOS transistor P1 312, while first PMOS transistor P1 remains off. Therefore, output node C 314, may be supplied with power only from second power supply B 426 via second power supply terminal 308, and not from first power supply A 424. In other words, output node 314 may be electrically connected to one of first power supply terminal 304 and second power supply terminal 308, and electrically disconnected from the other of first power supply terminal 304 and the second power supply terminal 308, depending on power supplied by first power supply terminal 304 and second power supply terminal 308.

According to various embodiments, output node 314 may be connected to external device 538. According to various embodiments, external device 538 may include a chip card power supply; for example, external device 538 may include a power supply circuit, e.g. a voltage regulator of a chip card. As shown in FIG. 4, according to various embodiments, external device 538 may include a PMOS bulk voltage generation circuit 558. For example, external device 538 may include the bulk of a PMOS transistor 558 configured to connect supply A 424 and supply B 426. So the bulk of the PMOS transistor 558 connected between supply A or supply B may be always connected to the higher voltage of supply A and supply B. One of the first power supply terminal 304 and second power supply terminal 308 may be configured to power external device 538 connected to output node 314, e.g. via output node 314.

Decision circuit 316, including comparator 528 and schmitt trigger circuit 532, inverter 536 and biasing circuit 546 may be powered by output node C, e.g. from the power supplied by one of first power supply terminal 304 and second power supply terminal 308 to output node C 314, therefore, power, e.g. current, e.g. voltage, for supplying the components may be only drained from the supply input (e.g. 424 or 426) currently selected. Comparator circuit 528 may be powered by a terminal connected to output node C 314. For example, output node C 314 may be connected to a first power supply terminal, e.g. a positive (+) power supply terminal of comparator 528.

According to various embodiments, first power supply terminal 304 may be connected to first power supply 424, wherein first power supply 424 may include a chip card reader device. According to various embodiments, first power supply terminal 304 may be connected to first power supply 424, wherein first power supply 424 may include a chip card reader device; and wherein second power supply terminal 308 may be connected to a second power supply 426, wherein second power supply 426 may include a direct current power source. According to various embodiments, second power supply terminal 308 may be connected to second power supply 308, wherein second power supply 308 may include at least one power supply from the following group of power supplies, the group consisting of: a battery, an electrochemical cell, a fuel cell, a voltage source, a rechargeable battery.

Circuit 502 may further include biasing circuit 546 connected to decision circuit 316, wherein biasing circuit 546 may be configured to control the decision speed of decision circuit 316. A second power supply terminal, e.g. a negative (−) power supply terminal of comparator 528 may be connected to biasing circuit 546. Biasing circuit 546 may include a power supply, which may be configured to deliver a bias current ibias to decision circuit 316, e.g. comparator circuit 528. Bias current ibias may be approximately independent from the output voltage at output node 314, wherein the output voltage at output node C 314 may be the supply voltage of the biasing circuit 316.

If only second power supply B 426 is available, e.g. only second power supply B 426, (e.g. a battery) is supplied at second power supply terminal 308, and first power supply A 424 is floating, biasing circuit 316 may be configured to work in slow mode. In slow mode, the comparator bias current may be in the range of nano Amperes. Therefore the decision circuit may work in ultra low power mode at rather slow decision speed, e.g. in the range if microseconds. Low power consumption is very important as power supply B could be battery with limited capacity.

As soon as power supply A is available (and VA exceeds VB+VH), output node C 314 may be connected as fast as possible to first power supply terminal A, i.e. first power supply 424. Therefore, biasing circuit 528 switches to increase bias current mode as soon as power supply A is detected (by sensing VA) causing the decision speed of the comparator 528 to increase (in the range of ns). Due to this behavior, output node C 314 is connected very fast to power supply A which is very important for some application scenarios in the field of chip card controllers.

Example application scenarios according to various embodiments include: a battery, an electrochemical cell, a fuel cell, a voltage source, a rechargeable battery.

For example, if supply B is connected to a lithium battery and supply A 424 is actually floating; assuming PMOS transistor Psw 558 may be turned off and its bulk connected to supply B 426 by the power selection circuit; then, assuming supply A 424 is powered suddenly, for example, as the chip card is inserted into a reader device, and voltage of supply A 424 is more than 0.7 V, i.e. forward voltage of a diode, larger than voltage of supply B 426; to avoid that any of the parasitic (source/bulk and drain/bulk) diodes 562 of Psw are opening (could cause latchup), the bulk of Psw may be connected as fast as possible to the higher voltage of supply A 424 or supply B 426. In this case, it is connected to supply A 424. On the other hand the bulk of Psw 558 may not need to be connected really fast to supply B 426 if supply A 424 is not present (this only happens once when the battery is connected to the chip card). In this state the chip card is not active the risk of latchup is low. For these reasons, a low decision speed may be acceptable.

The decision speed and power consumption of circuit 502 may be implemented as shown in FIG. 5B. If first power supply A 424 (chip card reader) is connected to first power supply terminal 304, and second power supply B 426 is not connected (floating) to second power supply terminal 308, then biasing circuit 546 may be configured to supply current to decision circuit 316 such that fast decision speed (nanoseconds) and increased current consumption (micro Amperes) may be implemented in comparator 528. If second power supply B 426 (battery) is connected to second power supply terminal 308, and first power supply B 424 is not connected (floating) to first power supply terminal 304, then biasing circuit 546 may be configured to supply a current to decision circuit 316 such that slow decision speed (microseconds) and low current consumption (nano Amperes) may be implemented in comparator 528. If first power supply A 424 (chip card reader) is connected to first power supply terminal 304, and second power supply B 426 is also connected to second power supply terminal 308, then biasing circuit 546 may be configured to supply current to decision circuit 316 such that fast decision speed (nanoseconds) and increased current consumption (micro Amperes) may be implemented in comparator 528. In other words, biasing circuit 546 may be configured to control the decision speed of decision circuit 316, depending on power supplied by first power supply terminal 304 and second power supply terminal 308. Furthermore, biasing circuit 546 may be configured to change, e.g. modulate, the decision speed of decision circuit 316 to a fast mode wherein first power supply terminal 304, e.g. a first power supply 424 connected to first power supply terminal 304, supplies power to circuit 502, and to modulate the decision speed of decision circuit 316 to a slow mode wherein second power supply terminal 308, e.g. second power supply 426 connected to second power supply terminal 308, supplies power to the circuit 502.

During the initial startup phase of circuit 502, both first PMOS transistor P1 306 and second PMOS transistor P2 312 may be turned off. In this case, output node C 314 may be temporarily supplied by the parasitic bulk to drain diodes of first PMOS transistor P1 306 and second PMOS transistor P2 312. As soon as the voltage at output node C 314 is sufficient for powering the decision circuit 316, including comparator 528 and Schmitt trigger 532, and/or inverter 536 and/or biasing circuit 546, first PMOS transistor P1 306 or second PMOS transistor P2 312 may be turned on and the current flowing through the parasitic diode stops. As current may flow in the parasitic diodes of first PMOS transistor P1 306 and second PMOS transistor P2 312 during the initial startup phase, these transistors may be enclosed by a guard ring due to latch up protection.

FIG. 6A shows circuit 602 according to an embodiment. Circuit 602 may include one or more or all of the features already described with respect to circuits 502, 402 and 302.

Circuit 602 may include a power selection circuit, which may be implemented in a chip card. For example, controller circuit, in a security controller circuit. Circuit 602 may include decision circuit 316, which may include power selection circuit, including comparator 528. Circuit 602 may further include biasing circuit 546, which may include fast biasing circuit 648 and slow biasing circuit 652. Fast biasing circuit 648 may include a diode D1, e.g. NMOS diode biased by serial resistor R1 supplied by first power supply 424, e.g. connected to a contact based reader. Slow biasing circuit 652 may include a power supplied independent circuit supplied by second power supply 426, e.g. connected to a lithium battery.

Fast biasing circuit 648 may include resistor R1, wherein a first terminal of resistor R1 may be connected to first power supply terminal 304, and second terminal of resistor R1 may be connected to first source/drain (S/D) terminal of NMOS diode D1. Second S/D terminal of NMOS diode D1 may be connected to a reference voltage VSSP, e.g. ground. Gate terminal of NMOS diode D1 may be connected to second terminal of resistor R1, and further connected to input terminal 654 of comparator 528. In other words, nbias1_i, i.e. nbias_fast from fast bias circuit 648 may be supplied to comparator 528 for controlling decision speed when first power supply 424 is connected to first power supply terminal 304.

Figure 7:
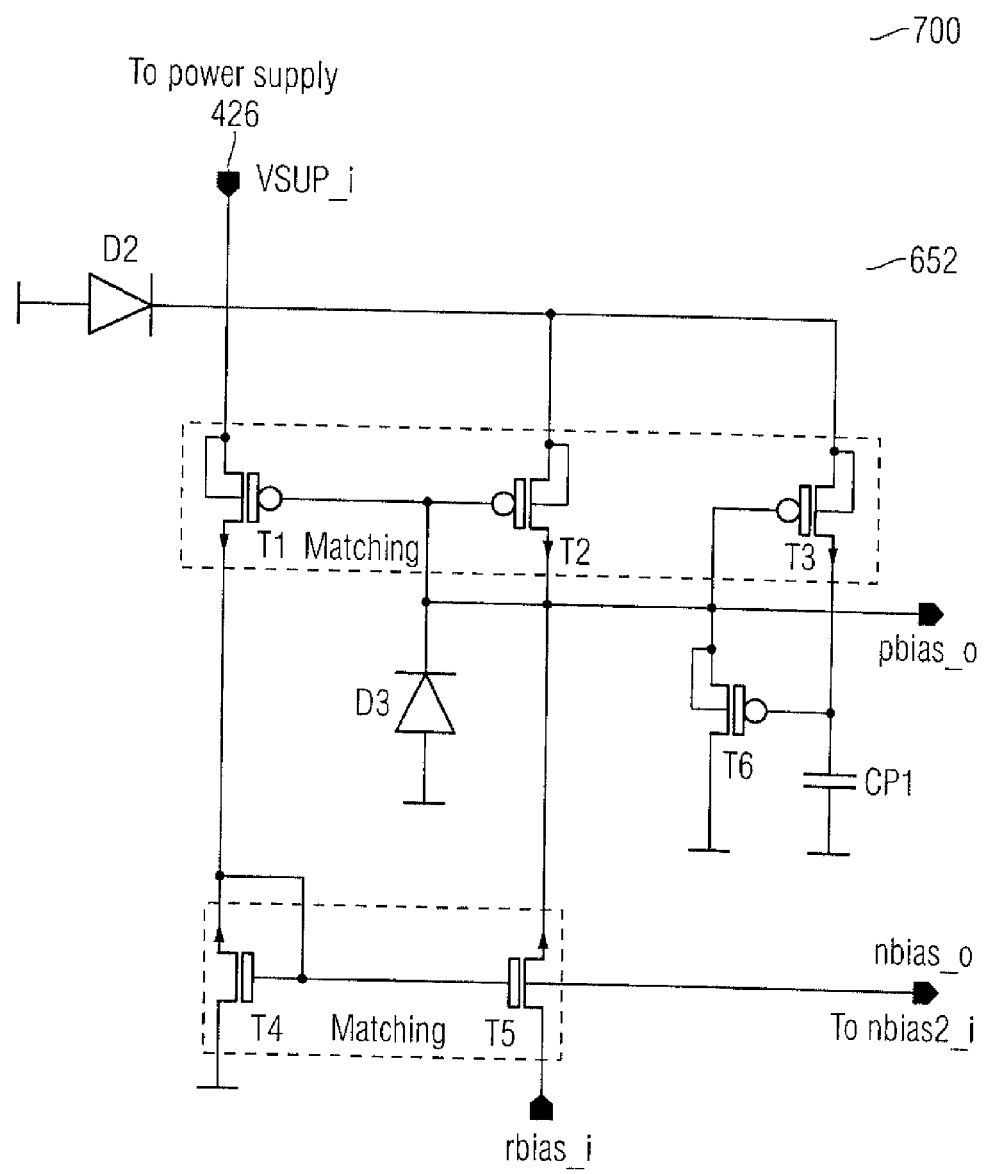
FIG. 7 shows a circuit according to an embodiment.

Referring to FIGS. 6A and 7, slow biasing circuit 652 may be connected to second power supply B 426 via second power supply terminal B 308, and may be implemented by a power supply independent biasing structure for generating a bias current which may be quite independent from supply voltage VB from second power supply B 426. This is important as second power supply B 426 may be connected to a lithium battery with a limited amount of charge stored.

As shown in FIG. 6A, slow biasing circuit 652 may include first input terminal VSUPi connected to second power supply terminal 308, and second input terminal rbias_i connected in series with first terminal of resistor R2. Second terminal of resistor R2 may be connected to a reference voltage VSSP, e.g. ground.

As shown in FIG. 7, first input terminal VSUPi of slow biasing circuit 652 may be connected to output terminal of diode D2. Input terminal of diode D2 may be connected to a reference voltage VSSP, e.g. ground. First input terminal VSUPi may be further connected to first S/D terminals of PMOS transistors T1, T2 and T3. Second S/D terminal of transistor T1 may be connected to first terminal of current source C1. Second terminal of current source C1 may be connected to first S/D terminal of NMOS transistor T4. First S/D terminal of NMOS transistor T4 may be connected to gate terminal of NMOS transistor T4. Second S/D terminal of NMOS transistor T4 may be connected to a reference voltage VSSP, e.g. ground. Second S/D terminal of transistor T2 may be connected to first terminal of current source C2. Second terminal of current source C2 may be connected to first S/D terminal of NMOS transistor T5. Second S/D terminal of NMOS transistor T5 may be connected to slow biasing circuit second input terminal rbias_i. NMOS transistor T4 and NMOS transistor T5 may be connected in current mirror configuration. Gate terminal of NMOS transistor T4 and gate terminal of NMOS transistor T5 may be connected to each other and to slow biasing circuit output terminal nbias_o.

PMOS transistor T1 may include a body diode, wherein a first S/D terminal of PMOS transistor T1 may be connected to a body of the PMOS transistor T1. Gate terminal of PMOS transistor T1 may be connected to an output terminal of diode D3, and further to gate terminal of PMOS transistor T2. PMOS transistor T2 include a body diode. Input terminal of diode D3 may be connected to a reference voltage VSSP, e.g. ground. Gate terminal of PMOS transistor T1 and gate terminal of PMOS transistor T2 and output terminal of diode D3 may be connected to slow biasing circuit output terminal pbias_o.

Gate terminal of PMOS transistor T3 and first S/D terminal of PMOS transistor T6 may be connected to slow biasing circuit output terminal pbias_o. Gate terminal of PMOS transistor T3 and first S/D terminal of PMOS may be connected to each other. Gate terminal of PMOS transistor T6 may be connected to first S/D terminal of PMOS transistor T6. Second S/D terminal of PMOS transistor T6 may be connected to reference voltage VSSP, e.g. ground. Gate terminal of PMOS transistor T6 may be connected to second S/D voltage of PMOS transistor T3. Second S/D voltage of PMOS transistor T3 may be connected to first terminal of capacitor CP1. Second terminal of capacitor CP1 may be connected to a reference voltage VSSP, e.g. ground.

Output terminal nbias_o may be connected to comparator input terminal 656. In other words, nbias2_i, i.e. nbias_slow from slow bias circuit 652 may be supplied to comparator 528 for controlling decision speed when second power supply 426 is connected to second power supply terminal 308.

As shown in FIG. 6A, output terminal nbias_o may be further connected to gate terminal of NMOS transistor T7. First S/D terminal of NMOS transistor T7 may be connected to first/SD terminal of NMOS diode D1 and gate terminal of NMOS diode D1. Second S/D terminal of NMOS transistor T7 may be connected to a reference voltage VSSP, e.g. ground. Comparator 528 may include an output terminal Vmax_o which may be connected to output node 314, e.g. output C.

Biasing and decision speed may be implemented in circuits 502, 602, 702 and 802 shown in FIG. 6B. If power supply A 424 is floating, i.e. disconnected, and power supply B 426 is connected to second power supply terminal 308, biasing may be slow, e.g. in the nano Amperes range, and decision speed may be slow, e.g. in the microsecond range. If power supply B 426 is floating, i.e. disconnected and power supply A 424 is connected to first power supply terminal 304, biasing may be fast, e.g. in the micro Amperes range, and decision speed may be fast, e.g. in the nanoseconds range. If power supply B 426 is connected to second power supply terminal 308 and power supply A 424 is connected to first power supply terminal 304, biasing may be slow and fast, e.g. wherein fast biasing may be up to 1000 times larger than slow biasing, e.g. in the microamperes range, decision speed may be fast, e.g. in the nanoseconds range.

Figure 8:
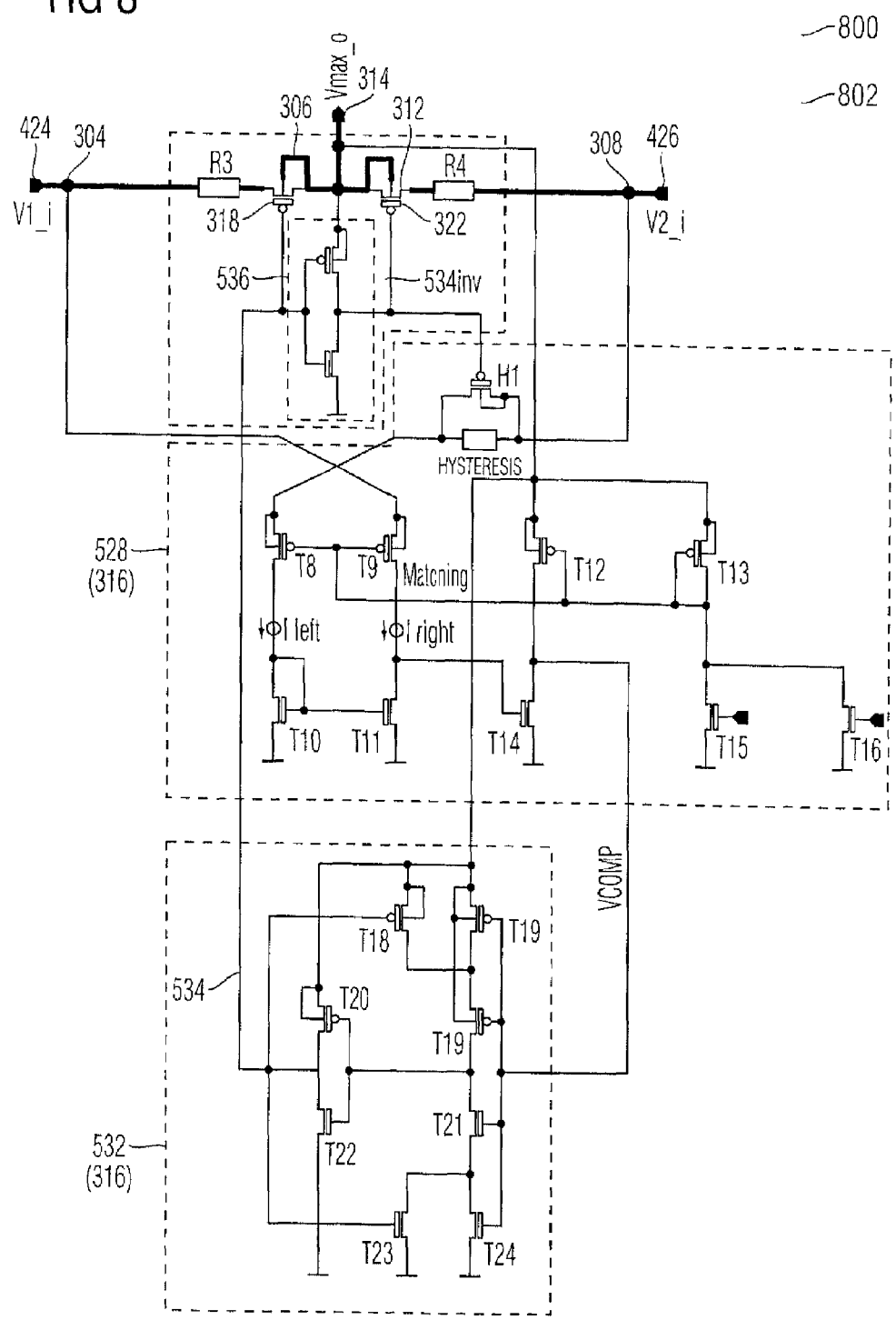
FIG. 8 shows a circuit according to an embodiment.

FIG. 8 shows circuit 802 according to an embodiment. Circuit 802 may include one or more or all of the features already described with respect to circuits 602, 502, 402 and 302.

First power supply terminal 304 may be connected to first PMOS transistor 306. First power supply 424 may be connected or disconnected (floating) from first power supply terminal 304. Resistor R3 may be connected between first S/D terminal of first PMOS transistor 306 and first power supply terminal 305.

Second power supply terminal 308 may be connected to second PMOS transistor 312. Second power supply 426 may be connected or disconnected (floating) from second power supply terminal 308. Resistor R4 may be connected between first S/D terminal of second PMOS transistor 312 and second power supply terminal 308.

Output node 314 may be connected between first PMOS transistor 306 and second PMOS transistor 312. Output node 314 may be connected to second S/D terminal of first PMOS transistor 306 and second S/D terminal of second PMOS transistor 312.

Decision circuit 316 may include comparator circuit 528. Comparator circuit 528 may be connected to first power supply terminal 304 and the second power supply terminal 308.

Comparator circuit 528 may include PMOS transistors T8, T9, T12, T13 and NMOS transistors T10, T11, T14, T15, T16. PMOS transistors T8, T9 may be connected to first power supply terminal 304 and the second power supply terminal 308. PMOS transistor T8 may be connected to second power supply terminal 308 via hysteresis circuit H1 connected between first S/D terminal of PMOS transistor T8 and second power supply terminal 308. First S/D terminal of PMOS transistor T9 may be connected, to first power supply terminal 304. PMOS transistors T8 and T9 may be connected to matching transistors PMOS T12 and T13. PMOS transistors T8 and T9 may be further coupled to current mirror matching transistors T10 and T11.

Comparator 528 of decision circuit 316 may be powered by output node 314, as shown via connection between output node 314 and PMOS transistors T12 and T13. Biasing signals, e.g. nbias_1, e.g. nbias_2, from biasing circuit 546 may be received via NMOS transistors T15 and T16. Fast biasing signals nbias_1 from fast biasing circuit 648 may be received by NMOS transistor T15. Slow biasing signals nbias_2 from slow biasing circuit 652 may be received by NMOS transistor T16, e.g. via their gate terminals. Output voltage Vcomp from comparator 528 may be connected to Schmitt trigger circuit 532. Schmitt trigger circuit 532 may also be powered by output node 314, as shown via connection between output node 314 and PMOS transistors T18 and T19.

Decision circuit output signal 534 may be provided from Schmitt trigger circuit output to first and second PMOS transistors 306 and 312. Gate terminals 318, 322 of the first PMOS transistor 306 and second PMOS transistor 312 may be complementarily and actively controlled by decision circuit 316. In other words, decision circuit output signal 534 may be supplied to gate terminal 318 of first PMOS transistor 306 and a complementary decision circuit output signal 534inv, obtained via inversion by inverter 536, may be supplied to gate terminal 322 of second PMOS transistor 312.

Circuit 802, i.e. power selection circuit, may include a current comparator 528 with hysteresis VH, wherein the comparator 528 may be configured to compare supply voltages V1_i (connected to a power supply, e.g. power supply A) and V2_i (connected to a power supply, e.g. power supply B). Hysteresis voltage VH may be implemented by hysteresis circuit H1. The output signal of the comparator, vcomp and eventually decision circuit output signal 534 may be provided to the PMOS switches 306, 312 via a Schmitt Trigger circuit 532. The output signal Vmax_o of the power selection circuit 802 may be connected to the output signal VC at the top level.

If V1_i exceeds the sum of V2_i and VH, VCOMP becomes low, first PMOS transistor 306 may be turned on and output node 314 VC may be connected to V1_i. If V2_i exceeds the sum of V1_i and VH, VCOMP becomes high, second PMOS transistor 312 may be turned on and output node 314 VC may be connected to V2_i. The comparator bias and therefore the decision speed of the power selection circuit may be controlled by nbias1_i and nbias2_i connected respectively to the fast and slow biasing circuit on top level.

FIG. 9 shows method 900 for selecting a power supply, the method including:

connecting a first power supply terminal to a first p-type metal oxide semiconductor transistor (in 910);

connecting a second power supply terminal to a second p-type metal oxide semiconductor transistor (in 920);

connecting an output node between the first p-type metal oxide semiconductor transistor and second p-type metal oxide semiconductor transistor (in 930); and connecting a decision circuit to the first power supply terminal and the second power supply terminal, the decision circuit being powered by the output node and the decision circuit complementarily and actively controlling gate terminals of the first p-type metal oxide semiconductor transistor and second p-type metal oxide semiconductor transistor (in 940).

According to various embodiments, method 900 may include electrically connecting the output node to one of the first power supply terminal and the second power supply terminal, and electrically disconnecting the output node from the other of the first power supply terminal and the second power supply terminal, depending on power supplied by the first power supply terminal and the second power supply terminal.

According to various embodiments, method 900 may include producing a decision circuit output signal based on a difference in power supplied by the first power supply terminal and power supplied by the second power supply terminal, the decision circuit output signal electrically activating one of the first p-type metal oxide semiconductor transistor and the second p-type metal oxide semiconductor transistor, and electrically deactivating the other of the first p-type metal oxide semiconductor transistor and the second p-type metal oxide semiconductor transistor.

According to various embodiments, method 900 may include electrically activating the first p-type metal oxide semiconductor transistor and not the second p-type metal oxide semiconductor transistor when power supplied to the first power supply terminal exceeds the sum of power supplied by the second power supply terminal and a hysteresis voltage of the decision circuit.

Various embodiments provide a circuit, including: a first power supply terminal connected to a first p-type metal oxide semiconductor transistor; a second power supply terminal connected to a second p-type metal oxide semiconductor transistor; an output node connected between the first p-type metal oxide semiconductor transistor and second p-type metal oxide semiconductor transistor; and a decision circuit connected to the first power supply terminal and the second power supply terminal, wherein the decision circuit is powered by the output node and wherein gate terminals of the first p-type metal oxide semiconductor transistor and second p-type metal oxide semiconductor transistor are complementarily and actively controlled by the decision circuit.

According to an embodiment, the first power supply terminal is connected to a first power supply, wherein the first power supply includes a chip card reader device.

According to an embodiment, the first power supply terminal is connected to a first power supply, wherein the first power supply includes a chip card reader device; and wherein the second power supply terminal is connected to a second power supply, wherein the second power supply includes a direct current power source.

According to an embodiment, the second power supply terminal is connected to a second power supply, wherein the second power supply includes at least one power supply from the following group of power supplies, the group consisting of: a battery, an electrochemical cell, a fuel cell, a voltage source, a rechargeable battery.

According to an embodiment, the decision circuit is configured to power supply A decision circuit output signal such that one of the first p-type metal oxide semiconductor transistor and the second p-type metal oxide semiconductor transistor is in an on-state, and the other of the first p-type metal oxide semiconductor transistor and the second p-type metal oxide semiconductor transistor is in an off-state, wherein power is supplied to the output node by a power supply electrically connected to the p-type metal oxide semiconductor transistor in the on-state.

According to an embodiment, the decision circuit is configured to compare power supplied by the first power supply terminal and power supplied by the second power supply terminal.

According to an embodiment, gate terminals of the first p-type metal oxide semiconductor transistor and second p-type metal oxide semiconductor transistor are complementarily and actively controlled by a decision circuit output signal, wherein the decision circuit output signal is based on power supplied by the first power supply terminal and power supplied by the second power supply terminal.

According to an embodiment, gate terminals of the first p-type metal oxide semiconductor transistor and second p-type metal oxide semiconductor transistor are complementarily and actively controlled by a decision circuit output signal, wherein the decision circuit output signal is based on a difference in power supplied by the first power supply terminal and power supplied by the second power supply terminal.

According to an embodiment, the decision circuit is configured to power supply A decision circuit output signal to electrically activate one of the first p-type metal oxide semiconductor transistor and the second p-type metal oxide semiconductor transistor, and to electrically deactivate the other of the first p-type metal oxide semiconductor transistor and the second p-type metal oxide semiconductor transistor.

According to an embodiment, the circuit further includes an inverter connected between a first p-type metal oxide semiconductor transistor gate terminal and the decision circuit.

According to an embodiment, the inverter is configured to invert a decision circuit output signal, such that an inverted decision circuit output signal is provided to the first p-type metal oxide semiconductor transistor gate terminal, and the decision circuit output signal is provided to the second p-type metal oxide semiconductor transistor gate terminal.

According to an embodiment, one of the first power supply terminal and the second power supply terminal is configured to power an external device connected to the output node.

According to an embodiment, the decision circuit includes a comparator circuit, wherein a first comparator circuit input terminal is connected to the first power supply terminal, and wherein a second comparator circuit input terminal is connected to the second power supply terminal.

According to an embodiment, the circuit further includes a Schmitt trigger circuit connected to the comparator circuit.

According to an embodiment, a decision circuit output signal is connected to the first p-type metal oxide semiconductor transistor and the second p-type metal oxide semiconductor transistor via the Schmitt trigger circuit.

According to an embodiment, the decision circuit includes a hysteresis voltage, wherein a decision circuit output signal is configured to electrically activate the first p-type metal oxide semiconductor transistor and not the second p-type metal oxide semiconductor transistor when power supplied by the first power supply terminal exceeds the sum of power supplied by the second power supply terminal and the hysteresis voltage.

According to an embodiment, a decision circuit output signal is configured to electrically activate the second p-type metal oxide semiconductor transistor and not the first p-type metal oxide semiconductor transistor when power supplied by the second power supply terminal exceeds the sum of power supplied by the first power supply terminal and the hysteresis voltage.

According to an embodiment, the circuit further includes a biasing circuit connected to the decision circuit, wherein the biasing circuit is configured to control the decision speed of the decision circuit.

According to an embodiment, the biasing circuit is configured to control the decision speed of the decision circuit, depending on power supplied by the first power supply terminal and the second power supply terminal.

According to an embodiment, the biasing circuit is configured modulate the decision speed of the decision circuit to a fast mode wherein the first power supply terminal supplies power to the circuit, and to modulate the decision speed of the decision circuit to a slow mode wherein the second power supply terminal supplies power to the circuit.

Various embodiments provide a method for selecting a power supply, the method including: connecting a first power supply terminal to a first p-type metal oxide semiconductor transistor; connecting a second power supply terminal to a second p-type metal oxide semiconductor transistor; connecting an output node between the first p-type metal oxide semiconductor transistor and second p-type metal oxide semiconductor transistor; and connecting a decision circuit to the first power supply terminal and the second power supply terminal, the decision circuit being powered by the output node and the decision circuit complementarily and actively controlling gate terminals of the first p-type metal oxide semiconductor transistor and second p-type metal oxide semiconductor transistor.

According to an embodiment, the method includes electrically connecting the output node to one of the first power supply terminal and the second power supply terminal, and electrically disconnecting the output node from the other of the first power supply terminal and the second power supply terminal, depending on power supplied by the first power supply terminal and the second power supply terminal.

According to an embodiment, the method includes producing a decision circuit output signal based on a difference in power supplied by the first power supply terminal and power supplied by the second power supply terminal, the decision circuit output signal electrically activating one of the first p-type metal oxide semiconductor transistor and the second p-type metal oxide semiconductor transistor, and electrically deactivating the other of the first p-type metal oxide semiconductor transistor and the second p-type metal oxide semiconductor transistor.

According to an embodiment, the method includes electrically activating the first p-type metal oxide semiconductor transistor and not the second p-type metal oxide semiconductor transistor when power supplied to the first power supply terminal exceeds the sum of power supplied by the second power supply terminal and a hysteresis voltage of the decision circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit, comprising:
   a first power supply terminal connected to a first p-type metal oxide semiconductor transistor;
   a second power supply terminal connected to a second p-type metal oxide semiconductor transistor;
   an output node connected between the first p-type metal oxide semiconductor transistor and second p-type metal oxide semiconductor transistor;
   a decision circuit connected to the first power supply terminal and the second power supply terminal, wherein the output node powers the decision circuit and where the power to the decision circuit is substantially the same as the power from the output node, and wherein gate terminals of the first p-type metal oxide semiconductor transistor and second p-type metal oxide semiconductor transistor are complementarily and actively controlled by the decision circuit; and
   a biasing circuit connected to the decision circuit, wherein the biasing circuit is configured to modulate the decision speed of the decision circuit to a fast mode wherein the first power supply terminal supplies power to the circuit, and to modulate the decision speed of the decision circuit to a slow mode wherein the second power supply terminal supplies power to the circuit; and wherein the output node powers the biasing circuit.

2. The circuit according to claim 1,
wherein the first power supply terminal is connected to a first power supply, wherein the first power supply comprises a chip card reader device.

3. The circuit according to claim 1,
wherein the first power supply terminal is connected to a first power supply, wherein the first power supply comprises a chip card reader device; and
wherein the second power supply terminal is connected to a second power supply,
wherein the second power supply comprises a direct current power source.

4. The circuit according to claim 1,
wherein the second power supply terminal is connected to a second power supply,
wherein the second power supply comprises at least one power supply from the following group of power supplies, the group consisting of: a battery, an electrochemical cell, a fuel cell, a voltage source, a rechargeable battery.

5. The circuit according to claim 1,
wherein the decision circuit is configured to power supply a decision circuit output signal such that one of the first p-type metal oxide semiconductor transistor and the second p-type metal oxide semiconductor transistor is in an on-state, and the other of the first p-type metal oxide semiconductor transistor and the second p-type metal oxide semiconductor transistor is in an off-state,
wherein power is supplied to the output node by a power supply electrically connected to the p-type metal oxide semiconductor transistor in the on-state.

6. The circuit according to claim 1,
wherein the decision circuit is configured to compare power supplied by the first power supply terminal and power supplied by the second power supply terminal.

7. The circuit according to claim 1,
wherein gate terminals of the first p-type metal oxide semiconductor transistor and second p-type metal oxide semiconductor transistor are complementarily and actively controlled by a decision circuit output signal,
wherein the decision circuit output signal is based on power supplied by the first power supply terminal and power supplied by the second power supply terminal.

8. The circuit according to claim 1,
wherein gate terminals of the first p-type metal oxide semiconductor transistor and second p-type metal oxide semiconductor transistor are complementarily and actively controlled by a decision circuit output signal,
wherein the decision circuit output signal is based on a difference in power supplied by the first power supply terminal and power supplied by the second power supply terminal.

9. The circuit according to claim 1,
wherein the decision circuit is configured to power supply a decision circuit output signal to electrically activate one of the first p-type metal oxide semiconductor transistor and the second p-type metal oxide semiconductor transistor, and to electrically deactivate the other of the first p-type metal oxide semiconductor transistor and the second p-type metal oxide semiconductor transistor.

10. The circuit according to claim 1, further comprising an inverter connected between a first p-type metal oxide semiconductor transistor gate terminal and the decision circuit.

11. The circuit according to claim 10,
wherein the inverter is configured to invert a decision circuit output signal, such that an inverted decision circuit output signal is provided to the first p-type metal oxide semiconductor transistor gate terminal, and the decision circuit output signal is provided to the second p-type metal oxide semiconductor transistor gate terminal.

12. The circuit according to claim 1,
wherein one of the first power supply terminal and the second power supply terminal is configured to power an external device connected to the output node.

13. The circuit according to claim 1,
wherein the decision circuit comprises a comparator circuit,
wherein a first comparator circuit input terminal is connected to the first power supply terminal, and wherein a second comparator circuit input terminal is connected to the second power supply terminal.

14. The circuit according to claim 13, further comprising a Schmitt trigger circuit connected to the comparator circuit.

15. The circuit according to claim 14,
wherein a decision circuit output signal is connected to the first p-type metal oxide semiconductor transistor and the second p-type metal oxide semiconductor transistor via the Schmitt trigger circuit.

16. The circuit according to claim 1,
wherein the decision circuit comprises a hysteresis voltage,
wherein a decision circuit output signal is configured to electrically activate the first p-type metal oxide semiconductor transistor and not the second p-type metal oxide semiconductor transistor when power supplied by the first power supply terminal exceeds the sum of power supplied by the second power supply terminal and the hysteresis voltage.

17. The circuit according to claim 16,
wherein a decision circuit output signal is configured to electrically activate the second p-type metal oxide semiconductor transistor and not the first p-type metal oxide semiconductor transistor when power supplied by the second power supply terminal exceeds the sum of power supplied by the first power supply terminal and the hysteresis voltage.

18. The circuit according to claim 1,
wherein the biasing circuit is configured to control the decision speed of the decision circuit, depending on power supplied by the first power supply terminal and the second power supply terminal.

19. A method for selecting a power supply, the method comprising:
connecting a first power supply terminal to a first p-type metal oxide semiconductor transistor;
connecting a second power supply terminal to a second p-type metal oxide semiconductor transistor;
connecting an output node between the first p-type metal oxide semiconductor transistor and second p-type metal oxide semiconductor transistor;
connecting a decision circuit to the first power supply terminal and the second power supply terminal, wherein the decision circuit is powered by the output node, and the decision circuit complementarily and actively controlling gate terminals of the first p-type metal oxide semiconductor transistor and second p-type metal oxide semiconductor transistor; and
connecting a biasing circuit to the decision circuit, wherein the biasing circuit is configured to modulate the decision speed of the decision circuit to a fast mode wherein the first power supply terminal supplies power to the circuit, and to modulate the decision speed of the decision circuit to a slow mode wherein the second power supply terminal supplies power to the circuit; and wherein the output node powers the biasing circuit.

20. The method according to claim 19, comprising electrically connecting the output node to one of the first power supply terminal and the second power supply terminal, and electrically disconnecting the output node from the other of the first power supply terminal and the second power supply terminal, depending on power supplied by the first power supply terminal and the second power supply terminal.

21. The method according to claim 19, comprising producing a decision circuit output signal based on a difference in power supplied by the first power supply terminal and power supplied by the second power supply terminal, the decision circuit output signal electrically activating one of the first p-type metal oxide semiconductor transistor and the second p-type metal oxide semiconductor transistor, and electrically deactivating the other of the first p-type metal oxide semiconductor transistor and the second p-type metal oxide semiconductor transistor.

22. The method according to claim 19, comprising electrically activating the first p-type metal oxide semiconductor transistor and not the second p-type metal oxide semiconductor transistor when power supplied to the first power supply terminal exceeds the sum of power supplied by the second power supply terminal and a hysteresis voltage of the decision circuit.

23. The circuit according to claim 1, wherein the output node has a direct connection to the decision circuit, and a direct connection to the biasing circuit.

* * * * *